United States Patent
Park

(10) Patent No.: US 8,154,946 B2
(45) Date of Patent: Apr. 10, 2012

(54) DATA STORAGE DEVICE

(75) Inventor: Kwang-Soo Park, Suwon-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 236 days.

(21) Appl. No.: 12/719,249

(22) Filed: Mar. 8, 2010

(65) Prior Publication Data

US 2010/0232197 A1    Sep. 16, 2010

(30) Foreign Application Priority Data

Mar. 10, 2009  (KR) .................. 10-2009-0020427

(51) Int. Cl.
*G11C 8/00*    (2006.01)
(52) U.S. Cl. .............................. 365/230.06; 365/230.02
(58) Field of Classification Search ............. 365/230.06, 365/230.02
See application file for complete search history.

(56) References Cited

U.S. PATENT DOCUMENTS

| | | | | |
|---|---|---|---|---|
| 6,134,169 A | * | 10/2000 | Tanaka | ............... 365/189.04 |
| 2003/0133350 A1 | * | 7/2003 | Nakao | ............... 365/230.03 |

FOREIGN PATENT DOCUMENTS

| | | |
|---|---|---|
| JP | 05-135584 | 6/1993 |
| JP | 08-063392 | 3/1996 |
| KR | 20000056711 | 9/2000 |
| KR | 20010047672 | 6/2001 |

* cited by examiner

*Primary Examiner* — Tuan T. Nguyen
(74) *Attorney, Agent, or Firm* — Stanzione & Kim, LLP

(57) ABSTRACT

A device to selectively activate memory chips includes a memory unit including n memory chips activated in response to n memory chip activation signals (n is a natural number), a controller to generate m control signals (m is a natural number), and a memory chip activation signal generator to combine m chip enable (CE) signals to generate the n memory chip activation signals.

20 Claims, 10 Drawing Sheets

FIG.5

|      | CE0      | CE1      | CE2      | CE3      |
|------|----------|----------|----------|----------|
| CE4  | SIGNAL1  | SIGNAL2  | SIGNAL3  | SIGNAL4  |
| CE5  | SIGNAL5  | SIGNAL6  | SIGNAL7  | SIGNAL8  |
| CE6  | SIGNAL9  | SIGNAL10 | SIGNAL11 | SIGNAL12 |
| CE7  | SIGNAL13 | SIGNAL14 | SIGNAL15 | SIGNAL16 |

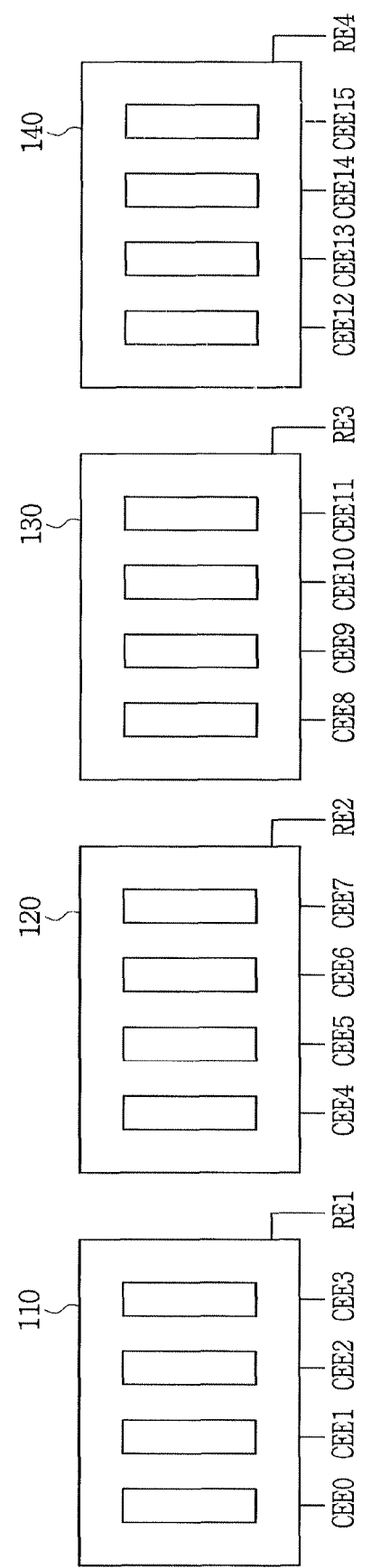

DATA STORAGE DEVICE

CROSS-REFERENCE TO RELATED APPLICATIONS

This application claims the benefit of priority under 35 U.S.C. §119 from Korean Patent Application No. 10-2009-0020427, filed on Mar. 10, 2009, the contents of which are hereby incorporated herein by reference in their entirety.

BACKGROUND

1. Field of the Invention

Example embodiments relate to a storage device to selectively activate memory chips. More particularly, example embodiments relate to a solid state disk/device (SSD) storage device including a circuit capable of generating a plurality of memory chip activation signals to selectively activate memory chips by combining existing chip enable (CE) signals to increase memory capacity without additional chip enable signals.

2. Description of the Related Art

Recently, solid state disks/devices (SSDs) have been used as data storage devices instead of hard disks, because SSDs have lower power consumption, noise, and weight, due to the absence of a mechanical driving device, compared to a hard disk.

SSDs employ flash memories or flash memory chips as storage media and the data storage capability of an SSD mainly depends on a controller to control the SSD. The controller generates signals to control the flash memories of the SSD, including chip enable control signals corresponding in number to the flash memories. Thus, increasing SSD memories (i.e., storage capacity of the SSD) requires chip enable control signals corresponding in number to the SSD memories.

Present technology makes it possible to connect memory chips only by the number of chip enable (CE) signals supported by a controller. In other words, a total number of memory chips that can be mounted on an SSD is limited by a total number of CE signals. A double stack package (DSP) includes two memory chips, such that a total number of memory chips that can be mounted on an SSD is 2*(total number of CEs).

That is, it is necessary to increase chip enable control signals in order to increase memories for a high capacity SSD. This, in turn, requires modification of hardware and a production process.

SUMMARY

Example embodiments provide a storage device having a circuit to allow controllable memories to increase using existing chip enable (CE) signals in order to minimize hardware modification.

Additional features and utilities of the present general inventive concept will be set forth in part in the description which follows and, in part, will be obvious from the description, or may be learned by practice of the general inventive concept.

Other objects of the present general inventive concept will be easily understood from the following description of example embodiments.

Features and utilities of the present general inventive concept may be realized by a storage device including a memory unit including n memory chips activated in response to n memory chip activation signals, where n is a natural number, a controller to generate m control signals, where m is a natural number smaller than n, and a memory chip activation signal generator to combine the m control signals and generate the n memory chip activation signals.

The n memory chips may be divided into k ranks, where k is equal to n/p, each including p memory chips, where p is a natural number smaller than n. Each rank may be designated by a corresponding rank select signal of the k rank select signals The memory chip activation signal generator may use k control signals of the m control signals, where k is a natural number smaller than m, as k rank select signals and combine the k rank select signals with the (m-k) control signals of the m control signals other than the k control signals to generate the n memory chip activation signals.

The controller may further generate k rank select signals.

The memory chip activation signal generator may combine each of the k rank select signals with the m control signals to generate the n memory chip activation signals.

The memory chip activation signal generator may generate the n memory chip activation signals by using c control signals of the m control signals, where c is a natural number smaller than m, as memory chip enable signals and using the (m-c) control signals other than the c control signals as select control signals to output the c control signals as the n memory chip activation signals.

Each of the n memory chips may output a ready/busy (R/B) signal to the memory chip activation signal generator to indicate a state of the memory chip, and the memory chip activation signal generator may use the (m-c) control signals to selectively output the R/B signals to the controller.

The memory chip activation signal generator may divide the m control signals into x control signals, where x is a natural number smaller than m, and (m-x) control signals other than the x control signals and combine the x control signals with the (m-x) control signals to generate the n memory chip activation signals.

The memory chip activation signal generator may be a reconfigurable semiconductor chip.

Each memory chip may include a plurality of memories, memory cells, or memory chips.

The storage device may be a solid state disk/device (SSD) and the memory chip may be a flash memory chip.

Features and/or utilities of the present general inventive concept may be realized by a data storage device including a chip enable signal generator to receive a plurality of first chip enable signals and a plurality of group enable signals and to output at least one second chip enable signal corresponding to the first chip enable signals and the group enable signals. The chip enable signal generator may include a plurality of second chip enable signal output terminals having a quantity "n" corresponding to a number "p" of the plurality of first chip enable signals times a number "k" of the plurality of group enable signals.

The chip enable signal generator may be capable of simultaneously outputting a number of second chip enable signals including any combination of second chip enable signals from only one second chip enable signal to "n" chip second chip enable signals.

The number "k" of the plurality of group enable signals may be greater than 1 and less than or equal to the number "p" of the plurality of first chip enable signals.

The data storage device may include a memory module including (p*k) memory chips, each memory chip electrically connected to the chip enable signal generator to receive a respective second chip enable signal from the chip enable signal generator.

The data storage device may include a controller electrically connected to the chip enable signal generator to output the plurality of first chip enable signals and the plurality of group enable signals to the chip enable signal generator.

The chip enable signal generator may be one of an erasable programmable read-only memory (EPROM), a programmable logic device (PLD), and an application-specific integrated circuit (ASIC).

Features and/or utilities of the present general inventive concept may be realized by a data storage device including a chip enable signal generator including a plurality of input terminals to receive a plurality of first chip enable signals, at least one selection signal, and a plurality of chip state signals, and including plurality of output terminals to output a plurality of second chip enable signals and at least one second chip state signal. The number "n" of output terminals corresponding to the second chip enable signals may correspond to a maximum binary value of the first chip enable signals.

The chip enable signal generator may further include a de-multiplexer (DeMUX) to receive the plurality of first chip enable signals and the at least one selection signal and to output the plurality of second chip enable signals and a multiplexer (MUX) to receive the plurality of first chip enable signals and the plurality of chip state signals and to output the at least one second chip state signal. A value of the at least one selection signal may be based on a value of the at least one second chip state signal.

The data storage device may include a controller electrically connected to the chip enable signal generator to output the plurality of first chip enable signals to the chip enable signal generator, to receive the at least one second chip state signal from the chip enable signal generator, and to output the at least one selection signal based on a value of the at least one second chip state signal.

The data storage device may include a memory module including "n" memory chips, each memory chip electrically connected to the chip enable signal generator to receive a respective second chip enable signal from the chip enable signal generator and to output a respective first chip status signal to the chip enable signal generator.

Features and/or utilities of the present general inventive concept may be realized by a computing device including a controller to output "p" first chip enables signals and "k" group selection signals, where p and k are whole numbers greater than 1, a chip enable signal generator electrically connected to the controller to receive the p first chip enable signals and k group selection signals and to output "n" second chip enable signals, where n equals p*k, and a memory module electrically connected to the chip enable signal generator, the memory module including n memory chips, each memory chip connected to a respective second chip enable signal of the n chip enable signals.

The chip enable signal generator may simultaneously output a plurality of second chip enable signals.

The computing device may include an interface to electrically connect the controller to an external device to give the external device access to the memory module.

The chip enable signal generator and the memory module may be located on a single printed circuit board, and the controller may be located on a separate printed circuit board.

The controller, the chip enable signal generator, and the memory module may be located on a single printed circuit board.

BRIEF DESCRIPTION OF THE DRAWINGS

Example embodiments are described in further detail below with reference to the accompanying drawings. It should be understood that various aspects of the drawings may have been exaggerated for clarity.

The above and/or other aspects of the present general inventive concept will become apparent and more readily appreciated from the following description of the exemplary embodiments, taken in conjunction with the accompanying drawings, in which:

FIG. 5 illustrates a table showing chip enable signals combined to increase memory chips according to an example embodiment.

FIGS. 6A-6C illustrate various configurations of rank enable and chip enable signals.

DETAILED DESCRIPTION OF THE EMBODIMENTS

Figure 1:
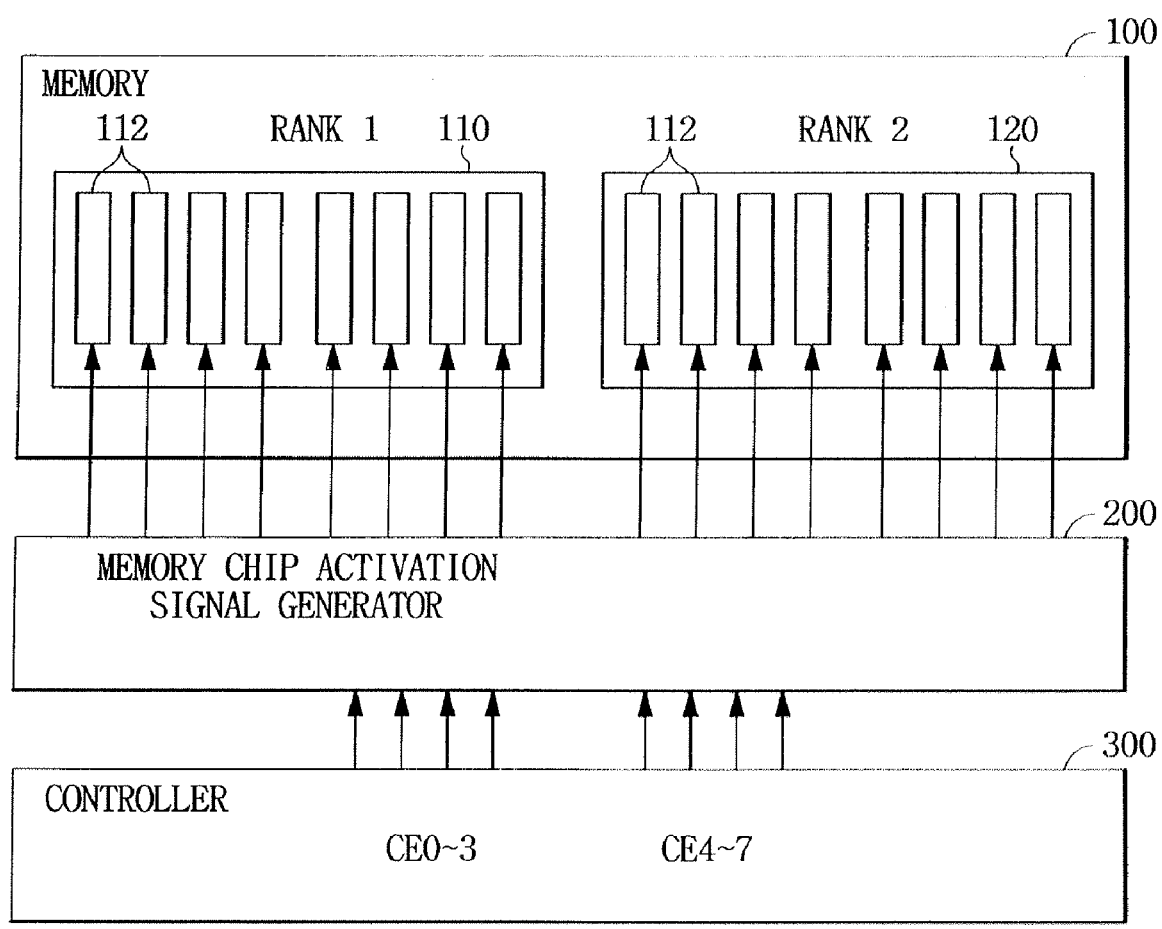
FIG. 1 is a block diagram of a storage device for selectively activating memory chips according to an example embodiment.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

While example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the inventive concept.

It will be understood that, although various terms may be used herein to describe various elements, these elements should not be limited by these terms. These terms are only used to distinguish one element from another. The terminology used herein is for the purpose of describing particular embodiments only and is not intended to be limiting of example embodiments. Singular forms "a," "an" and "the" are intended to include the plural forms as well, unless the context clearly indicates otherwise.

FIG. 1 is a block diagram of a storage device capable of selectively activating memory chips according to an example embodiment.

The storage device according to the example embodiment includes a memory unit 100, a memory chip activation signal generator or chip enable signal generator 200, and a controller 300.

The memory unit 100 may include a total number of n memory chips 112 (n is a natural number). The memory unit 100 may be divided into k ranks or groups (k=n/p) to be externally recognized as a single memory unit. Each rank or group may include p memory chips 112 (p is a natural number equal to or smaller than n). Each memory chip 112 may be a flash memory chip, for example.

For example, when a memory chip has 4-gigabyte capacity, the memory unit 100 may include one rank having eight memory chips 112 to be externally recognized as one 32-gigabyte capacity SSD, or the memory unit 100 may include two ranks 110 and 120 each having eight memory chips 112 to be externally recognized as two 32-gigabyte capacity SSDs. For convenience of illustration, it is assumed that k=2, n=16 and p=8.

The memory chips 112 are enabled or disabled by memory chip activation signals applied from the memory chip activation signal generator 200 as input signals.

Each memory chip 112 may consist of a double stack package (DSP) including two memories. For example, when the memory chip is a 4-gigabyte DSP memory chip, the memory chip may include two 2-gigabyte memories. The two memories in the DSP memory chip may be simultaneously enabled or disabled by one memory chip activation signal. Each memory chip 112 may include three or more memories, memory cells, or stacked memory chips.

The memory chip activation signal generator 200 may be configured as a reconfigurable semiconductor chip that includes various logic circuits according to a design scheme or a memory chip number. Here, the reconfigurable semiconductor chip may be one of an erasable programmable read-only memory (EPROM), a programmable logic device (PLD), and an application-specific integrated circuit (ASIC). That is, the memory chip activation signal generator 200 may include logic circuits to receive control signals (hereinafter, referred to as chip enable signals) as input signals from the controller 300 and output memory chip activation signals to activate the memory chips in the memory unit 100.

The memory chip activation signal generator 200 may receive k chip enable signals of m chip enable signals (m is a natural number), as rank select signals, and combine the k chip enable signals with the (m-k) other chip enable signals to output n memory chip activation signals (n is a natural number) to activate the memory chips in the memory unit 100. Alternatively, the memory chip activation signal generator 200 may receive k rank select signals and m chip enable signals and combine the k rank select signals with the m chip enable signals to output n memory chip activation signals to activate n memory chips. The m may be smaller than the n.

As described above, the memory chip activation signal generator 200 may include the logic circuits each including various logic gates such that the memory chip activation signal generator 200 can have various circuit combinations according to a design scheme or a memory chip number.

The controller 300 outputs m chip enable signals to the memory chip activation signal generator 200 to control the memory chips 112 in the memory unit 100, and controls states of the m chip enable signals to control data input/output with respect to the memory chips 112 in the memory unit 100. The controller 300 may also output k rank select signals.

Although in FIG. 1, the controller 300 outputs the m (=8) chip enable signals to the memory chip activation signal generator 200, which outputs the n (=16) memory chip activation signals to the memory unit 100, this configuration in FIG. 1 is only an example embodiment and the numbers of the chip enable signals and the memory chip activation signals may be changed.

Figure 2:
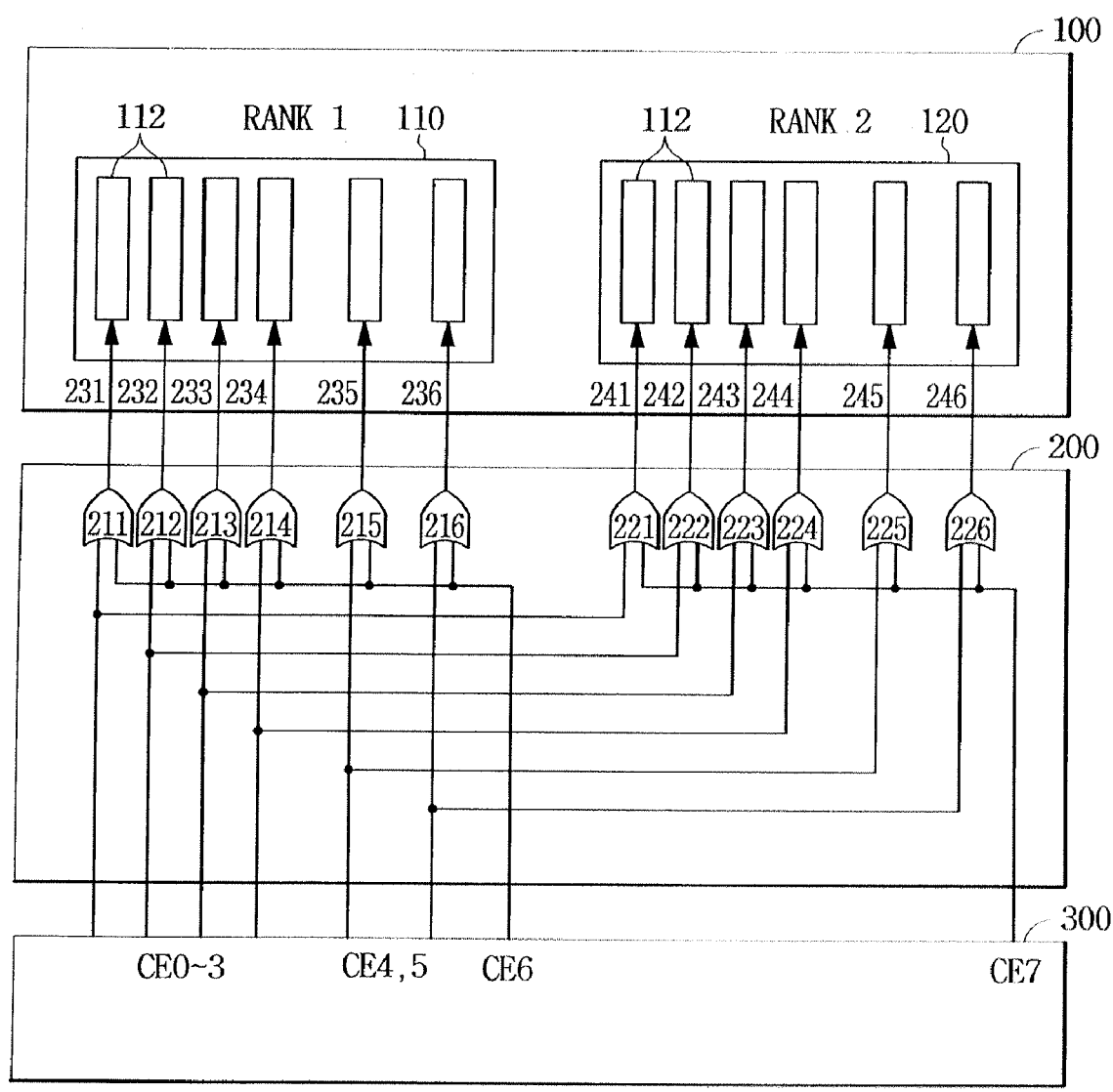
FIG. 2 is a block diagram of a storage device in which some chip enable signals from a controller are used as rank select signals to increase selectable memory chips according to an example embodiment.

FIG. 2 is a block diagram of a storage device in which some of chip enable signals from a controller 300 are used as rank select signals to increase selectable memory chips according to an example embodiment.

A memory chip activation signal generator 200 may include a plurality of logic gates 211 to 216 and 221 to 226 each receiving a chip enable signal CE6 or CE7 of chip enable signals CE0 to CE7 as a rank select signal and receiving one of the other chip enable signals CE0 to CE5 to output a memory activation signal.

Referring to FIG. 2, the memory chip activation signal generator 200 selects RANK1 110 or RANK2 120 using the chip enable signal CE6 or CE7 of the eight chip enable signals as a rank select signal. The chip enable signal CE6 as the rank select signal is intended to select RANK1 110 of a memory unit 100 and activate memory chips included in the selected RANK1 110. The chip enable signal CE7 as the rank select signal is intended to select RANK2 120 of the memory unit 100 and activate memory chips included in the selected RANK2 120. Hereinafter, it is assumed that the ranks are activated when the chip enable signals CE6 and CE7 as the rank select signals are 'low.'

When the chip enable signal CE6 is 'low' and the chip enable signal CE7 is 'high,' the memory chip activation signal generator 200 may output one of the memory chip activation signals 231 to 236 applied to the RANK1 110, as a 'low' signal, to activate RANK1 110 and output the memory chip activation signals 241 to 246 applied to RANK2 120, as a 'high' signal, to deactivate the RANK2 120. When the chip enable signal CE7 is 'low' and the chip enable signal CE6 is 'high,' the memory chip activation signal generator 200 may output one of the memory chip activation signals 241 to 246 applied to RANK2 120, as a 'low' signal, to activate RANK2 120 and output the memory chip activation signals 231 to 236 applied to RANK1 110, as a 'high' signal, to deactivate RANK1 110.

Specifically, the chip enable signal CE6 is input to the OR gates 211 to 216 together with the chip enable signals CE0, CE1, CE2, CE3, CE4, and CE5. Accordingly, only when the chip enable signal CE6 is 'low,' the memory chip activation signals 231 to 236 output from the OR gates 211 to 216 are changed with states of the chip enable signals CE0, CE1, CE2, CE3, CE4, and CE5. For example, the OR gate 211, which receives the chip enable signal CE0 and the chip enable signal CE6, outputs a low memory chip activation signal 231 only when the chip enable signal CE6 is 'low' and the chip enable signal CE0 is 'low.'

That is, both the rank select signal CE6 and the chip enable signal must be 'low' to activate the memory chips included in RANK1 110.

The chip enable signal CE7 is input to the OR gates 221 to 226 together with the chip enable signals CE0, CE1, CE2, CE3, CE4, and CE5. Accordingly, only when the chip enable signal CE7 is 'low,' the memory chip activation signals 241 to 246 output from the OR gates 221 to 226 are changed with the states of the chip enable signals CE0, CE1, CE2, CE3, CE4, and CE5. For example, the OR gate 221, which receives the chip enable signal CE0 and the chip enable signal CE7, outputs a low memory chip activation signal 241 only when the chip enable signal CE7 is 'low' and the chip enable signal CE0 is 'low.'

As shown in FIG. 2, selectable memory chips can increase without additional chip enable signals from the controller 300 by using some chip enable signals CE6 and CE7 of the existing chip enable signals CE0 to CE7 as the rank select signals, thereby increasing capacity of an SSD.

Although the two chip enable signals CE6 and CE7 of the eight chip enable signals are used as the rank select signals to make twelve memory chips available in the example embodiment of FIG. 2, the inventive concept is not limited to the example embodiment, but may be modified.

Figure 3:
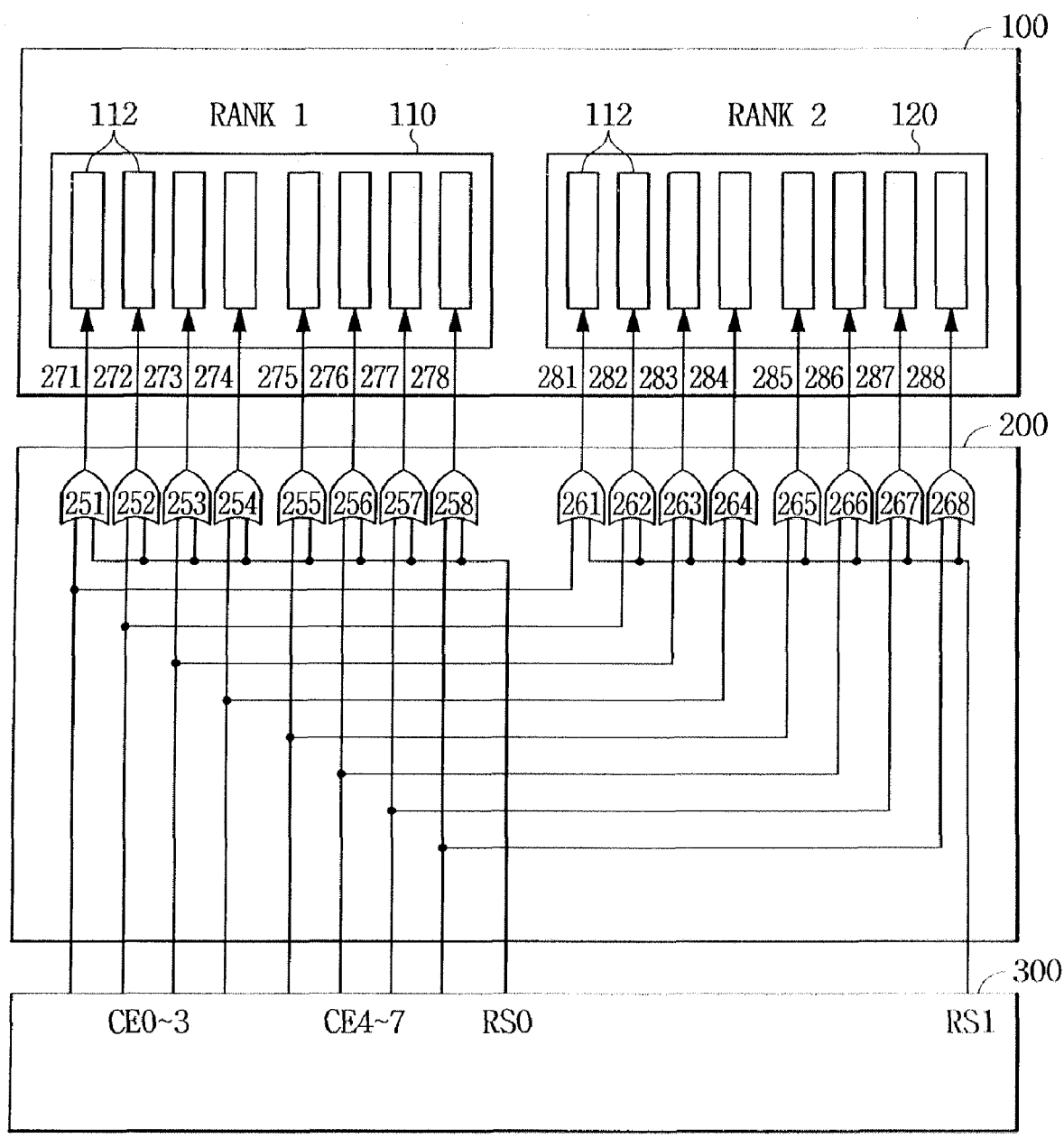
FIG. 3 is a block diagram of a storage device in which additional rank select signals from a controller are used to increase memory chips according to an example embodiment.

FIG. 3 is a block diagram of a storage device in which additional rank select signals from a controller are used to increase memory chips according to an example embodiment.

In FIG. 3, the number of chip enable signals is 8, each number of ranks and rank select signals is 2, and the number of memory chips in each rank is 8. In this case, the memory chip activation signal generator 200 generates 16 memory chip activation signals to activate a total of 16 memory chips (or 32 memory chips for a DSP).

A controller 300 generates rank select signals RS0 and RS1 for selecting RANK1 110 or RANK2 120 of a memory unit 100, as well as chip enable signals CE0 to CE7, and outputs the signals to a memory chip activation signal generator 200. The rank select signals RS0 and RS1 are required to select any rank of the memory unit 100 and activate memory chips included in the selected rank as illustrated in FIG. 2. That is, the rank select signals RS0 and RS1 may activate the memory chips included in the selected rank.

The memory chip activation signal generator 200 may include OR gates 251 to 258 each receiving one of the chip enable signals CE0 to CE7 and the rank select signal RS0 from the controller 300 and outputting memory chip activation signals 271 to 278, and OR gates 261 to 268 each receiving one of the chip enable signals CE0 to CE7 and the rank select signal RS1 from the controller 300 and outputting memory chip activation signals 281 to 288. Accordingly, since the memory chip activation signals 271 to 278 are always 'high' irrespective of states of the chip enable signals CE0 to CE7 when the rank select signal RS0 is 'high,' RANK1 110 of the memory unit 100 is always deactivated. On the other hand, when the rank select signal RS0 is 'low,' the memory chip activation signals 271 to 278 are 'high' or 'low' according to the states of the chip enable signals CE0 to CE7. For example, when the rank select signal RS0 is 'low' and the chip enable signal CE3 is 'low,' the memory chip activation signal 274 is 'low' so that a corresponding one of the memory chips can be enabled.

Since a circuit and method to activate memory chips of RANK2 120 are the same as the circuit and method to activate memory chips of RANK1 110, a detailed description of the former will be omitted.

When the controller 300 additionally generates the rank select signals RS0 and RS1 to increase the memory chips as illustrated in FIG. 3, 8CE*2RS=16. Accordingly, a total of 16 memory chips are available. When the memory chip is a DSP, 32 memories are available.

Figure 4:
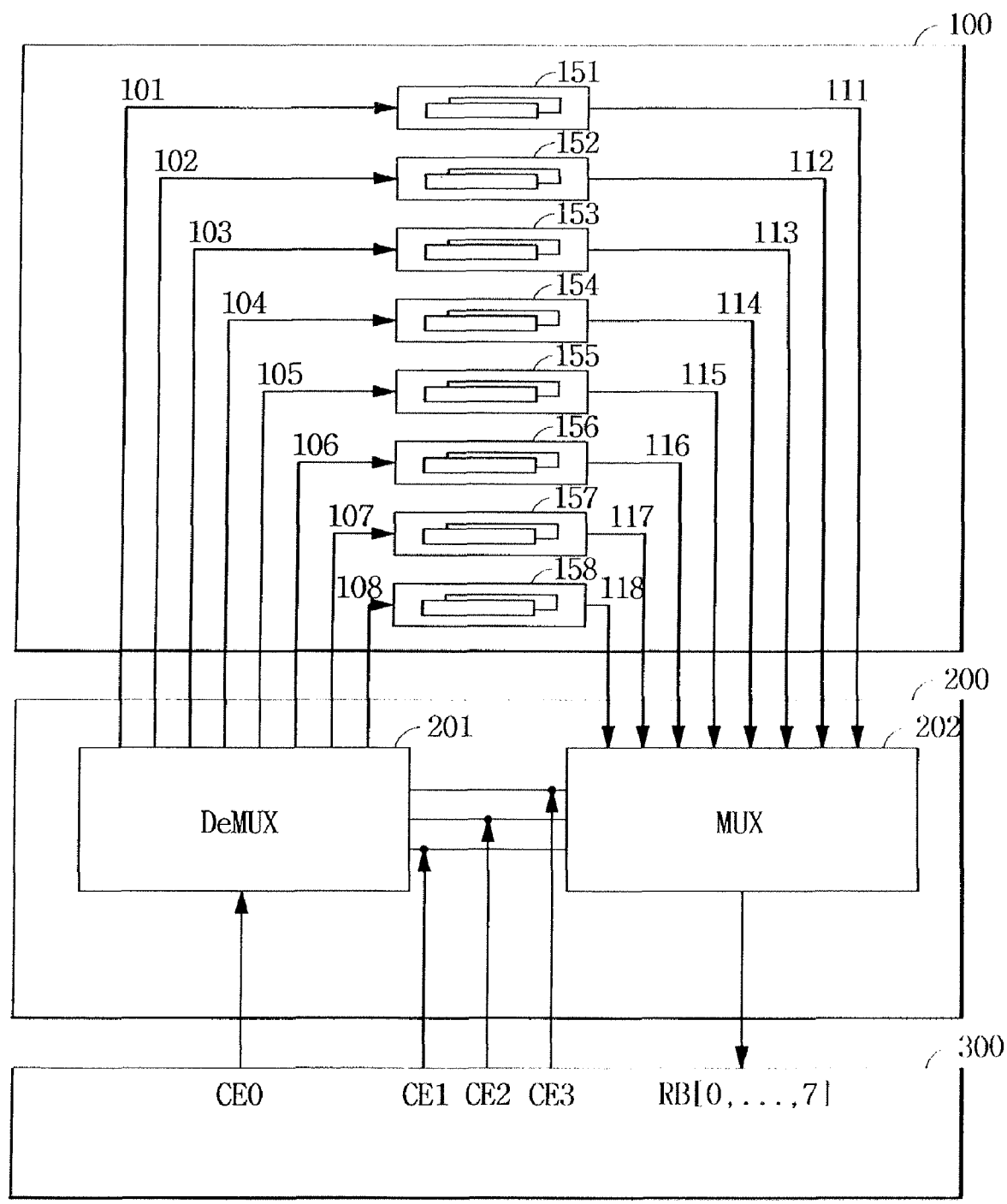
FIG. 4 is a block diagram of a storage device in which multiplexer and demultiplexer circuits are used to increase selectable memory chips according to an example embodiment.

FIG. 4 is a block diagram of a storage device in which multiplexer and demultiplexer circuits are used to increase selectable memory chips according to an example embodiment.

A circuit and method to control 16 memory chips using a multiplexer (MUX) circuit 202, a demultiplexer (DeMUX) circuit 201, and four chip enable signals CE0, CE1, CE2, and CE3 will now be described with reference to FIG. 4.

A controller 300 outputs the four chip enable signals CE0, CE1, CE2, and CE3 to a memory chip activation signal generator 200.

The memory chip activation signal generator 200 may include the DeMUX circuit 201 to receive the chip enable signal CE0 as an input signal and the three chip enable signals CE1, CE2, and CE3 as select control signals and output eight memory chip activation signals 101 to 108, and the MUX circuit 202 configured to receive eight ready/busy (R/B) signals 111 to 118 as input signals from a memory unit 100 and the three chip enable signals CE1, CE2, and CE3 as select control signals, select one of the eight R/B signals 111 to 118 according to the select control signals, and output the selected R/B signal.

The memory unit 100 includes eight DSP memory chips 151 to 158 each including two memories, i.e., a total of 16 memories. Each of the DSP memory chips 101 to 108 in the memory unit 100 is enabled or disabled according to a state of one of the memory chip activation signals 101 to 108 applied as an input signal from the DeMUX circuit 201. For example, when the signal CE0 is 'low' and the memory chip activation signal 103 is 'low' according to a combination of the select control signals CE1, CE2, and CE3, memories included in the DSP memory chip 153 connected with the memory chip activation signal 103 are enabled.

However, when the memory chip is enabled to read or write data, use of the memory chip may be limited according to a state of the memory chip. The memory chip indicates, to the controller 300, whether the memory chip is in a ready state where the memory chip is currently accessible and available or in a busy state where the memory chip is in use and writing data to the memory chip is impossible. The controller 300 receives a memory chip state (R/B) signal from the memory chip and enables the memory chip only when the memory chip is ready.

In FIG. 4, the MUX circuit 202 is used to generate the memory chip state signal indicating states of the increased memory chips.

The DSP memory chips 151 to 158 in the memory unit 100 generate R/B signals 111 to 118 indicating their states and output the R/B signals 111 to 118 to the memory chip activation signal generator 200. The R/B signals 111 to 118 are input to the MUX circuit 202, selected by a combination of the multiplexer select control signals CE1, CE2, and CE3, and output as memory chip state signals RB[0,1,2,3,4,5,6,7] for the memory chips. The output memory chip state signals RB[0,1,2,3,4,5,6,7] are input to the controller 300 and used to recognize the states of the memory chips.

For example, when data is to be written to the first DSP memory chip 151, the controller 300 outputs the chip enable signals CE1, CE2, and CE3 corresponding to the DSP memory chip 151. The MUX circuit 202 selects R/B signal 111 corresponding to the first DSP memory chip 151 to output to the controller 300 as the first memory chip state signal RB0. The controller 300 receives the memory chip state signal RB0 to recognize the state of the first DSP memory chip 151 to determine whether the first DSP memory chip 151 is "ready" or "busy." For example, if the memory chip 151 is already enabled, the signal R/B signal 111 may be at a voltage level corresponding to "busy."

On the other hand, if the first DSP memory chip is ready to receive or transmit data, the controller 300 outputs a 'low' chip enable signal CE0 to the memory chip activation signal generator 200. The 'low' chip enable signal CE0 is input to the DeMUX circuit 201 and output as the memory chip activation signal 101 to enable the first DSP memory chip 151. Since the select control signals input to the MUX circuit 202 and the DeMUX circuit 201 serve as the same chip enable signals CE1, CE2, and CE3, the memory chip activation signals 101 to 108 output from the DeMUX circuit 201 and the memory chip state signals RB[0,1,2,3,4,5,6,7] output from the MUX circuit 202 are associated with the same DSP memory chip.

Since the four chip enable signals CE0, CE1, CE2, and CE3 make the eight DSP memory chips 101 to 108 available in FIG. 4, a total number of available memories is 16, or 8 double stacked packages. When the MUX circuit 202 and the DeMUX circuit 201 are used as illustrated in FIG. 4, and the controller 300 outputs eight chip enable signals, seven chip enable signals can be input as select control signals to the DeMUX circuit 201 and the MUX circuit 202, which makes it possible to control a maximum of 128 DSP memory chips. Accordingly, a total number of available memories or memory chips is 256.

FIG. 5 illustrates a table showing chip enable signals combined to increase memory chips according to an example embodiment.

A memory chip activation signal generator 200 may divide a plurality of chip enable signals from the controller 300 into two groups and combine signals from the different groups with each other to generate memory chip activation signals. In this case, the number of the generated memory chip activation signals is equal to a product of numbers of the signals in the respective groups. That is, when n chip enable signals are divided into two groups—one group of x chip enable signals and the other group of (n-x) chip enable signals—a total number of generated memory chip activation signals is x*(n-x) (where x is a natural number smaller than n).

For example, a maximum of 16 different memory chip activation signals Signal1 to Signal16 can be generated by dividing eight chip enable signals CE0 to CE7 into two groups—group 1 of CE0 to CE3 and group 2 of CE4 to CE7—and combining CE0 to CE3 in group 1 with CE4 to CE7 in group 2 as shown in FIG. 5.

Thus, since using the method illustrated in FIG. 5 makes it possible to control a total of 16 DSP memory chips, a maximum of 32 memories are available.

Since the device and method to select one signal from the two respective groups and combining the signals in FIG. 5 are equivalent to using two signals as input signals of different logic gates to generate different output signals as described above, a detailed description of the device and method will be omitted. That is, x*(n-x) logic gates are necessary in the example embodiment of FIG. 5.

Figure 6A:
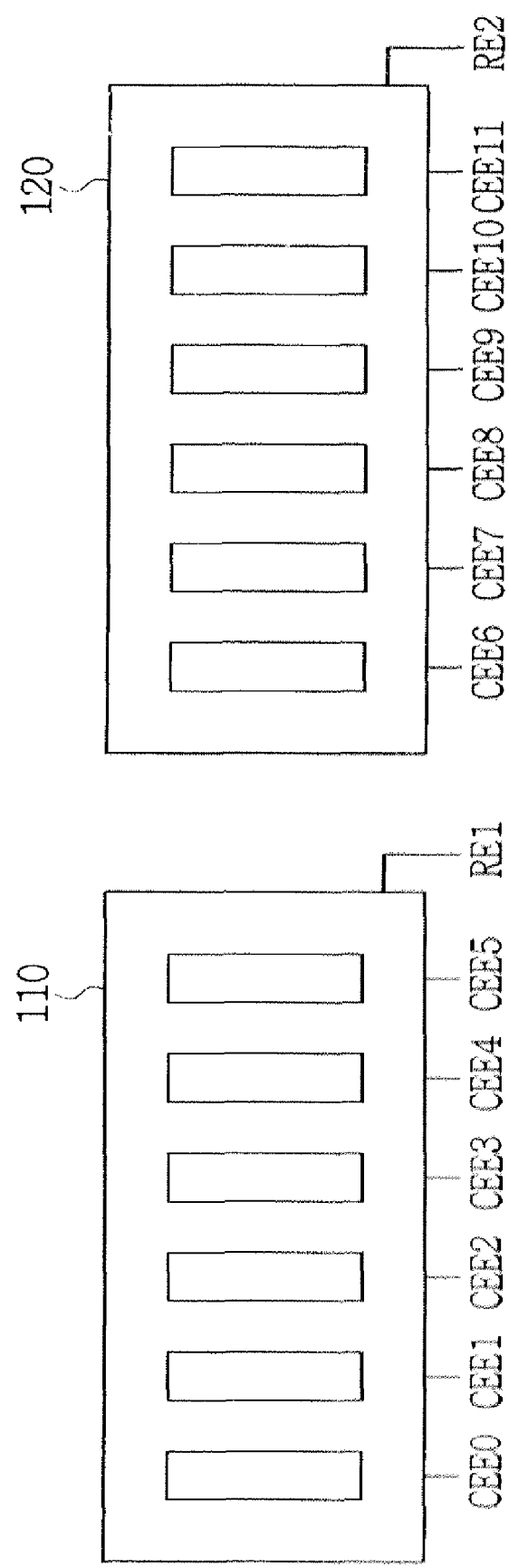
Figure 6B:
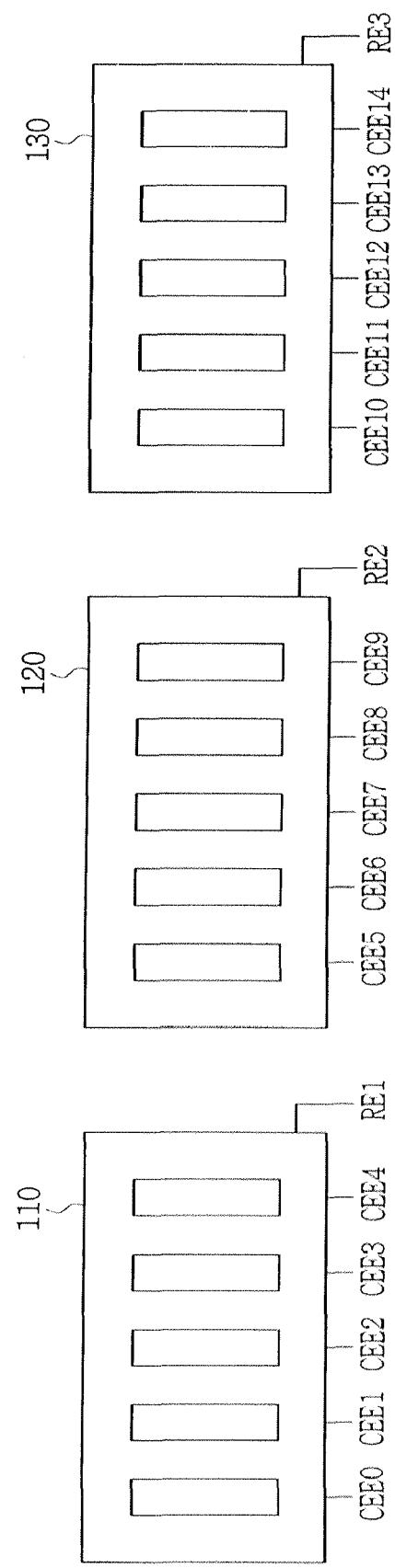

As illustrated in FIGS. 6A-6C, a controller that outputs 8 enable signals may control twelve, fifteen, and sixteen memory chips 112 or DSPs, respectively, according to the proportion of rack enable signals (RE) to chip enable signals (CE). Similar to FIG. 2, in FIG. 6A, two enable signals from the controller are designated as rack enable signals RE1 and RE2 to enable operation of the memory chips 112 of the racks 110 and 120, respectively. The remaining 6 enable signals may be designated as chip enable signals CEE0-CEE5 or CEE6-CEE11, respectively, to enable one or more memory chips 112 simultaneously. This way, the number of selectable memory chips can still be 12 although the controller outputs 8 enable signals.

As illustrated in FIG. 6B, if three controller enable signals are designated as rack enable signals RE1, RE2, and RE3 to enable the memory chips 112 of the racks 110, 120, and 130, respectively, then the remaining five controller enable signals may be used as chip enable signals CEE0-CEE4, CEE5-CEE9, or CEE10-CEE14, respectively, to control a total of 15 memory chips 112, DSPs, or memory chip packages. This way, the number of selectable memory chips can still be 15 although the controller outputs 8 enable signals.

As illustrated in FIG. 6C, if four controller enable signals are designated as rack enable signals RE1, RE2, RE3, and RE4 to enable the memory chips 112 of the racks 110, 120, 130, and 140, respectively, then the remaining four controller enable signals may be used as chip enable signals CEE0-CEE3, CEE4-CEE7, CEE8-CEE11, or CEE12-CEE15, respectively, to control a total of 16 memory chips 112, DSPs, or memory chip packages. This way, the number of selectable memory chips can still be 16 although the controller outputs 8 enable signals.

Thus, a number of memory chips 112 controlled by a controller 300 may be increased without increasing the required number of enable signals output from the controller 300.

According to example embodiments, controllable memory chips can increase without additional chip enable signals from the controller, thereby minimizing modification of the controller and hardware.

Also, memory chip activation signals to control the memory chips can be generated by constituting a circuit for variously combining existing chip enable signals using reconfigurable semiconductor devices such as an ASIC, a FPGA, and an EPROM, thereby forming various methods and circuits according to demands from designers or users.

Figure 7A:
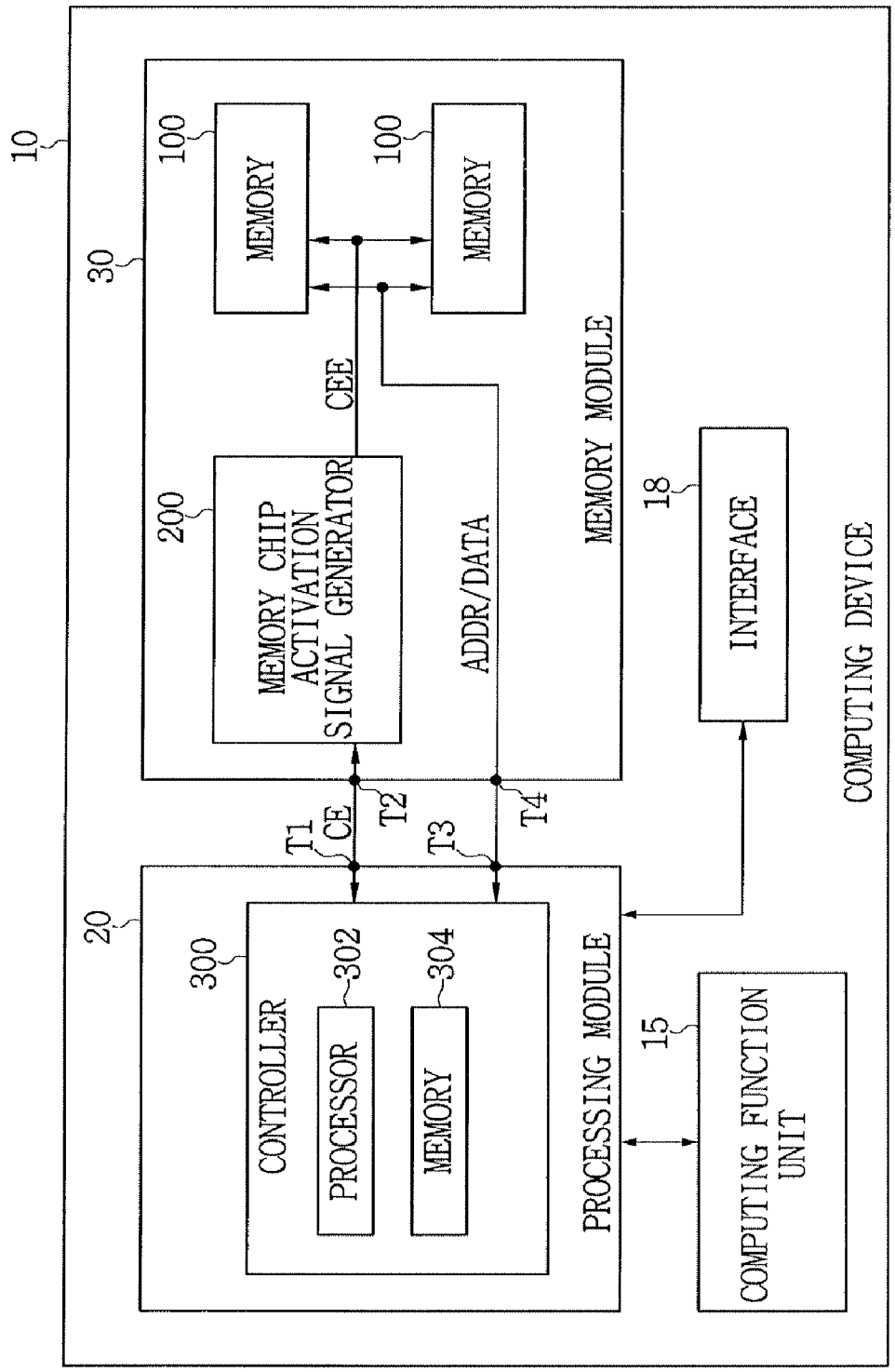
FIGS. 7A and 7B illustrate a computing device including a memory module according to the present general inventive concept.
Figure 7B:
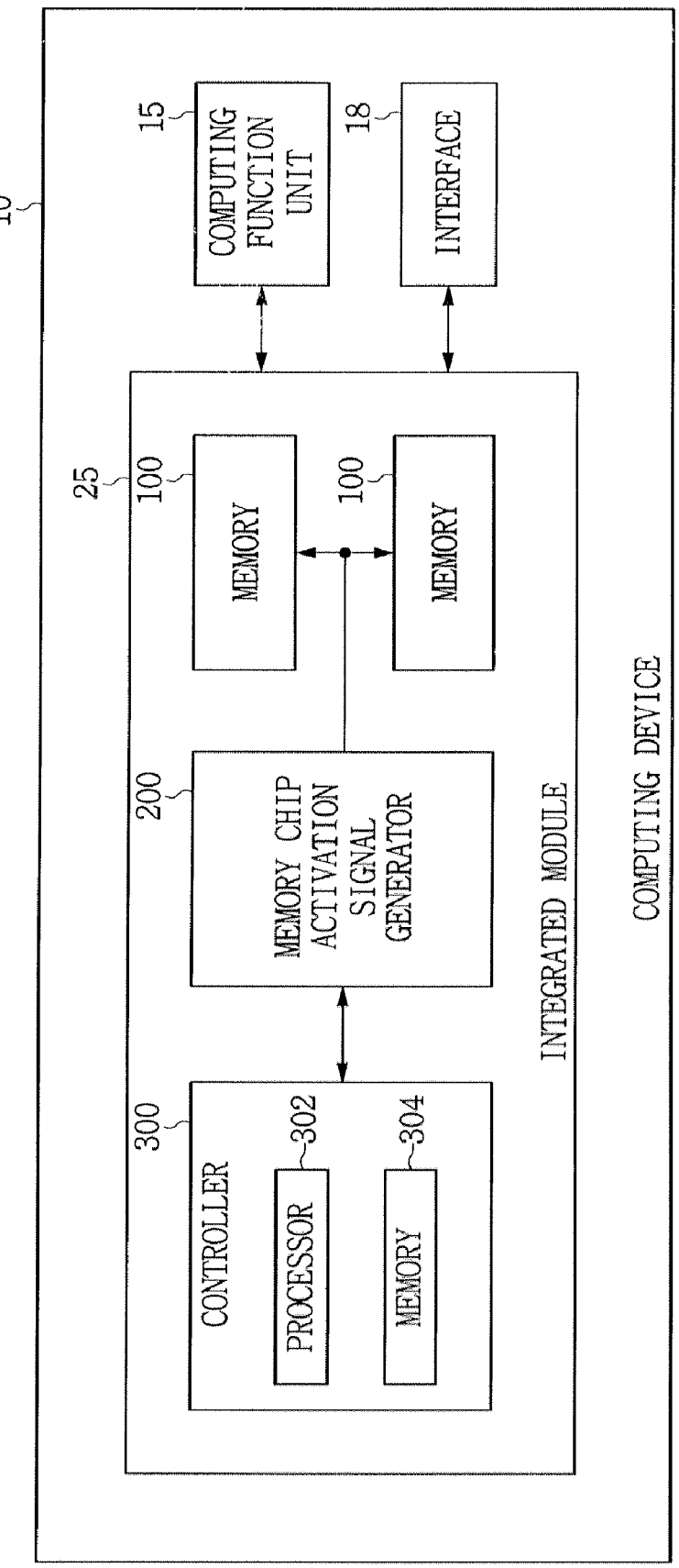

FIGS. 7A and 7B illustrate a computing device 10 including a memory module 30 according to the present general inventive concept. A computing device 10 may include a processing module 20 including the controller 300. The controller 300 may include one or more processors 302, memory 304, and other supporting logic and circuitry. The processing module 20 may be located on a circuit board distinct from the memory module 30 and any additional computing function units 15. The processing module 20 may be electrically connected to the memory module 30 via one or more terminals T1 and T3.

The memory module 30 may include the memory chip activation signal generator 200 and one or more memory chips or modules 100. The memory module 30 may be connected to the processing module via one or more terminals T2 and T4. The controller 300 may transmit chip enable signals CE to the memory chip activation signal generator 200 via terminals T1 and T2. The controller 300 and memory chips 100 may transmit and receive address and data via the terminals T3 and T4. In addition, the address/data lines may be connected to external modules or devices (not shown).

For example, if the controller 30 includes eight enable signal outputs, the memory module may transmit the eight enable signals CE via terminals T1. When a memory module 30 according to the present general inventive concept is connected to the terminal T1 via terminal T2, the memory chip activation signal generator 200 may generate chip enable signals CE to correspond to the respective memory chips 100 as discussed above. The controller 300 and memory chips 100 may then transmit and receive data via terminals T3 and T4.

The controller 300 may sense a type of memory connected to the processing module 20 to output corresponding chip enable signals CE. For example, if the controller determines that a conventional memory module (not shown) is connected to the terminal T1, the controller 300 may output eight chip enable signals CE. However, if the controller 300 detects a memory module 30 according to the present general inventive concept, the controller 300 may output a combination of chip enable signals CE and rack enable signals RE. The controller 300 may detect a type of memory module by reading data from a predetermined portion of memory 100, from a read-only memory chip, or by any other method. Consequently, the processing module 20 may automatically adapt to different types of memory modules.

The computing device 10 may include one or more computing function units 15 that perform various computing functions of the computing device 10, such as outputting displays, graphics, sounds, running specific programs, or controlling hardware or software. The computing function unit 15 may include dedicated processors, memory, and logic, or may share operation of the processor 302, memory 304, or supporting logic of the processing module 20.

The computing device 10 may also include an interface 18, which may include hardware to allow a user to operate the computing device 10, ports to communicate with external devices, or wireless transceivers to communicate with external devices.

FIG. 7B illustrates a computing device 10 similar to that of FIG. 7A, except the controller 300, memory chip activation signal generator 200, and memory chips 100 are all located on an integrated module 25. The integrated module 25 may be a single printed circuit board, for example. The one or more computing function units 15 and interface 18 of the computing device 10 may access the memory 100 by communicating with the controller 300 of the integrated module 25.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

Although a few embodiments of the present invention have been shown and described, it would be appreciated by those skilled in the art that changes may be made in these embodiments without departing from the principles and spirit of the general inventive concept, the scope of which is defined in the claims and their equivalents.

What is claimed is:

1. A data storage device comprising:
a memory unit including n memory chips activated in response to n memory chip activation signals, where n is a natural number;
a controller configured to generate m control signals, where m is a natural number smaller than n; and
a memory chip activation signal generator configured to combine the m control signals and generate the n memory chip activation signals.

2. The data storage device of claim 1, wherein the memory chip activation signal generator uses k control signals of the m control signals, where k is a natural number smaller than m, as k rank select signals and combines the k rank select signals with the (m-k) control signals of the m control signals other than the k control signals to generate the n memory chip activation signals.

3. The data storage device of claim 2, wherein the n memory chips are divided into k ranks each including p memory chips, where p is a natural number smaller than n, and designated by a corresponding rank select signal of the k rank select signals, and k is equal to n/p.

4. The data storage device of claim 1, wherein the controller further generates k rank select signals, and
the memory chip activation signal generator combines each of the k rank select signals with the m control signals to generate the n memory chip activation signals.

5. The data storage device of claim 4, wherein the n memory chips are divided into k ranks each including p memory chips, where p is a natural number smaller than n, and designated by a corresponding rank select signal of the k rank select signals, and k is equal to n/p.

6. The data storage device of claim 1, wherein the memory chip activation signal generator generates the n memory chip activation signals by using c control signals of the m control signals, where c is a natural number smaller than m, as memory chip enable signals and using the (m-c) control signals other than the c control signals as select control signals to output the c control signals as the n memory chip activation signals.

7. The data storage device of claim 6, wherein each of the n memory chips outputs a ready/busy (R/B) signal to the memory chip activation signal generator to indicate a state of the memory chip, and
the memory chip activation signal generator uses the (m-c) control signals to selectively output the R/B signals to the controller.

8. The data storage device according to claim 7, wherein the chip activation signal generator comprises:
a de-multiplexer (DeMUX) to receive the c control signals as input signal and the (m-c) control signals as select control signal and to output the n memory chip activation signals; and
a multiplexer (MUX) to receive the R/B signals as input signal and the (m-c) control signals as select control signal and to output one of the R/B signals.

9. The data storage device of claim 1, wherein the memory chip activation signal generator divides the m control signals into x control signals, where x is a natural number smaller than m and (m-x) control signals other than the x control signals and combines the x control signals with the (m-x) control signals to generate the n memory chip activation signals.

10. The data storage device of claim 1, wherein the memory chip activation signal generator is a reconfigurable semiconductor chip.

11. The data storage device of claim 1, wherein each of the n memory chips comprises a plurality of memories.

12. The data storage device of claim 1, wherein the storage device is a solid state disk/device (SSD) and the memory chip is a flash memory chip.

13. A data storage device, comprising:
a chip enable signal generator to receive a plurality of first chip enable signals and a plurality of group enable signals and to output at least one second chip enable signal corresponding to the first chip enable signals and the group enable signals,
wherein the chip enable signal generator includes a plurality of second chip enable signal output terminals having a quantity "n" corresponding to a number "p" of the plurality of first chip enable signals times a number "k" of the plurality of group enable signals.

14. The data storage device according to claim 13, further comprising:
a memory module including (p*k) memory chips, each memory chip electrically connected to the chip enable signal generator to receive a respective second chip enable signal from the chip enable signal generator.

15. The data storage device according to claim 13, further comprising:
a controller electrically connected to the chip enable signal generator to output the plurality of first chip enable signals and the plurality of group enable signals to the chip enable signal generator.

16. The data storage device according to claim 13, wherein the chip enable signal generator is one of an erasable programmable read-only memory (EPROM), a programmable logic device (PLD), and an application-specific integrated circuit (ASIC).

17. A computing device, comprising:
- a controller to output "m" control signals, where m is whole number greater than 1;
- a chip enable signal generator electrically connected to the controller to receive the "m" control signals and to output "n" second chip enable signals, where n is greater than m; and
- a memory module electrically connected to the chip enable signal generator, the memory module including n memory chips, each memory chip connected to a respective chip enable signal of the n chip enable signals.

18. The computing device according to claim 17, further comprising:
- an interface to electrically connect the controller to an external device to give the external device access to the memory module.

19. The computing device according to claim 17, wherein the chip enable signal generator and the memory module are located on a single printed circuit board, and
the controller is located on a separate printed circuit board.

20. The computing device according to claim 17, wherein the controller, the chip enable signal generator, and the memory module are located on a single printed circuit board.

* * * * *